United States Patent [19]

Axenov et al.

[11] Patent Number: 4,551,221

[45] Date of Patent: Nov. 5, 1985

[54] VACUUM-ARC PLASMA APPARATUS

[76] Inventors: Ivan I. Axenov, ulitsa Valtera, 21-a, kv. 45; Viktor G. Bren, ulitsa Sumskaya, 124, kv. 3; Valentin G. Padalka, ulitsa Danilevskogo 10, kv. 122; Leonid P. Sablev, ulitsa P.Morozova, 3, kv. 3; Rimma I. Stupak, ulitsa Valtera, 12, kv. 32; Vladimir M. Khoroshikh, prospekt 50-letiya VLKSM, 42, kv. 128, all of Kharkov, U.S.S.R.

[21] Appl. No.: 640,554

[22] PCT Filed: Mar. 2, 1981

[86] PCT No.: PCT/SU81/00022

§ 371 Date: Feb. 23, 1982

§ 102(e) Date: Feb. 23, 1982

[87] PCT Pub. No.: WO82/00075

PCT Pub. Date: Jan. 7, 1982

Related U.S. Application Data

[63] Continuation of Ser. No. 355,577, Feb. 23, 1982, abandoned.

[30] Foreign Application Priority Data

Jun. 25, 1980 [SU] U.S.S.R. .............................. 2933851

[51] Int. Cl.$^4$ .............................................. C23C 13/08
[52] U.S. Cl. ................................. 204/298; 118/723; 118/50.1; 118/726; 427/37; 427/38
[58] Field of Search ............... 118/723, 50.1, 726; 427/37, 38, 47; 204/298

[56] References Cited

U.S. PATENT DOCUMENTS

| | | | |
|---|---|---|---|
| 2,972,695 | 2/1961 | Wroe | 313/157 |
| 3,625,848 | 12/1971 | Snaper | 204/192 R |
| 3,783,231 | 1/1974 | Sablev et al. | 219/123 |
| 3,793,179 | 2/1974 | Sablev et al. | 204/298 |
| 3,836,451 | 9/1974 | Snaper | 204/298 |

FOREIGN PATENT DOCUMENTS

| | | | |
|---|---|---|---|
| 349325 | 3/1978 | U.S.S.R. | 427/38 |
| 563826 | 3/1978 | U.S.S.R. | 427/38 |
| 307666 | 1/1979 | U.S.S.R. | 427/37 |

OTHER PUBLICATIONS

Karr, "Vacuum Deposition of Material Films on Substrates Utilizing Controlled Plasma", IBM Tech. Disclosure Bulletin, vol. 19, No. 5, Oct. 1976.
"Evaporation from an Electric Arc in a Vacuum", L. Holland, Nature, vol. 178, No. 4528, p. 328, (1956).
"Vacuum-Arc Evaporation of Refractory Metals", M. S. P. Lucas, et al., Review of Scientific Instruments, vol. 32, No. 2, pp. 113-114, (1961).
"Pulsed Metallic-Plasma Generators", A. S. Gilmour, et al., Proc. IEEE, vol. 60, No. 8, p. 977, (1972), (USSR).

*Primary Examiner*—Norman Morgenstern
*Assistant Examiner*—Bernard F. Plantz
*Attorney, Agent, or Firm*—Fleit, Jacobson, Cohn & Price

[57] ABSTRACT

The apparatus comprises a consumable cathode (1) having a working end face (3), a solenoid (4) coaxially disposed relative to the consumable cathode (1) and having a tubular anode (5) received therein, an igniting electrode (6). Solenoid (4) encircles the tubular anode (5) and the consumable cathode (1), the number of turns per unit length of the solenoid (4) around the consumable cathode (1) being greater than the number of turns per unit length in the remaining portion of the solenoid (4).

Moreover, the solenoid (4) extends beyond the igniting electrode (6) at the side opposite to the working end face (3) by a length exceeding half the length of the portion of the solenoid (4) disposed around the consumable cathode (1).

2 Claims, 1 Drawing Figure

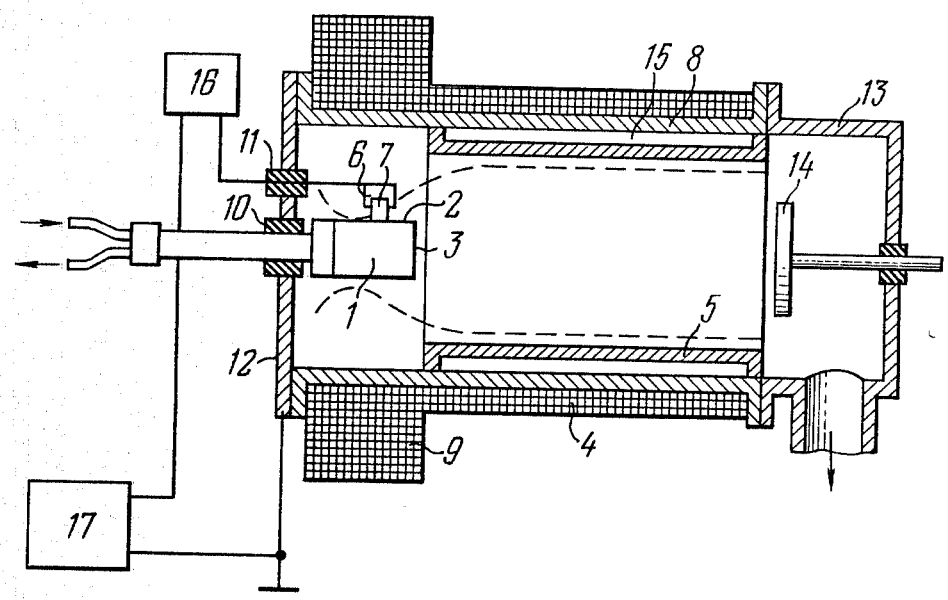

VACUUM-ARC PLASMA APPARATUS

This application is a continuation of application Ser. No. 355,577, filed Feb. 23, 1982, now abandoned.

The invention relates to vacuum-arc plasma apparatus and can be utilized for application of metallic coatings, cleaning and pickling surfaces, and spraying a getter material.

BACKGROUND ART

In the vacuum evaporization of metals such coatings as anticorrosive, wear-resistant, refractory, antifriction, superconductive, optical etc. are produced.

Vacuum application of coatings can be carried out by means of an electron-beam apparatus, wherein metal vapour is formed in evaporization of metals from crucibles by an electron beam. The use of crucibles does not permit producing coatings from refractory metals. Moreover, the coatings thus obtained are contaminated by a crucible material.

The vacuum-arc plasma apparatus makes it possible to produce pure coatings from any metals, refractory ones among them.

In such an apparatus a consumable cathode is evaporized by means of an arc discharge, a plasma flow of the metal vapor is formed, said metal being in a highly ionized state at a high value of energy and concentration of particles, and in the following condensation thereof forming a coating.

Vacuum-arc plasma apparatuses create a diverging plasma flow of a material being evaporated, the coefficient of utilization of the plasma flow in the application of coatings being low. The plasma flow of the material being evaporized is to be focused to produce coatings.

Known in the art is a vacuum-arc apparatus (USSR Author's Certificate No. 416,789 issued 25 Nov. 1974), comprising a consumable cathode, an anode disposed coaxially therewith, and an igniting electrode.

An arc discharge between the consumable cathode and the anode is excited by means of the igniting electrode.

The consumable cathode generates a wide divergent flow of metallic plasma, and thus the efficiency of utilization of the material being evaporated for producing coatings is low. For this reason the utilization of the above apparatus for vacuum metallization is inexpedient.

Also known in the art is an impulse generator of metallic plasma (A. S. Gilmour, D. L. Lochwood. Pulsed metallic-plasma generators, Proc. JEEE, 60, 8, 977, 1972), comprising a consumable cathode, a solenoid disposed coaxially therewith, and an anode disposed within the solenoid and an igniting electrode. The igniting electrode encircles the consumable cathode and is separated therefrom by an insulator. The ignition of an arc discharge is accomplished by a current pulse causing evaporization of a conductive film from the surface of said insulator. The film is restored during the burning of the arc discharge. The flow of metallic plasma, generated by the consumable cathode, is focused by an axially-symmetrical magnetic field of the solenoid, thereby acquiring a narrower directional diagram.

The above apparatus increases the efficiency of utilization of the evaporized material of a consumable cathode. However, an increase in the flow of the evaporized material of a consumable cathode at the outlet of the apparatus is limited by a partial reflection of ions from a magnetic barrier created at the ends of the solenoid. Moreover, the above generator is not suitable for operation in a stationary operation mode because of design features of igniting electrode.

Known in the art is a vacuum-arc plasma apparatus allowing the efficiency of utilization of the evaporized material of a consumable cathode to be increased in a stationary operation mode (I. I. Aksenov, V. G. Padalka, V. T. Toloka, V. M. Khoroshikh. Fokusirovka potoka metallicheskoi plazmy, generiruyemogo statsionarnym erozionnym elektrodugovym uskoritelem, sb. "Istochniki i uskoriteli plasmy, Vyp. 3, Kharkov, 1978, s. 45–50).

The apparatus comprises a consumable cathode having a working end face, a solenoid being coaxial therewith, a tubular anode disposed within the solenoid, and an igniting electrode.

In this apparatus, the igniting electrode excites an arc discharge. The flow of metallic plasma, generated by the consumable cathode, is focused by an axially-symmetric magnetic field of the solenoid. Such an arrangement permits obtaining a narrower directional diagram of the metal being evaporated and increasing the efficiency of utilization thereof.

However, in the above device a portion of the ion component of the plasma flow is reflected from an electromagnetic barrier occuring in the operation of the device due to the deviation of magnetic lines of force at the end face of the solenoid, said portion missing the substrate. Another disadvantage of the above device is an unstable ignition and burning of the arc discharge, which can be explained by the following reasons. In the case of location of the igniting electrode at the working end of the consumable cathode there occur failures in the operation because of the damage of the igniting electrode caused by a stationary arc discharge. The igniting electrode being disposed at a side surface of the consumable cathode, the stability of the ignition process is disturbed since a cathode spot being excited on the side surface is thrown by the magnetic field of the solenoid to the side opposite to the working end of the consumable cathode. Such "throwing aside" terminates with extinction of the arc discharge. Spontaneous "runnings-out" of the cathode spot from the working end of the consumable cathode to the side surface thereof terminate in a similar way.

DISCLOSURE OF INVENTION

The invention is based upon a problem to provide a vacuum-arc apparatus wherein a solenoid having different number of turns along the winding length per length unit is so disposed relative to a consumable cathode, a tubular anode, and an igniting electrode that the configuration and the magnitude of a magnetic field thereby obtained ensure the most efficient utilization of the evaporized material of a consumable cathode and a stable operation of the apparatus.

The problem is solved by that in a vacuum-arc plasma apparatus comprising a consumable cathode having a working end face, a solenoid disposed coaxially therewith, a tubular anode disposed within said solenoid, and an igniting electrode, according to the invention, the solenoid encircles the tubular anode and the consumable cathode, and the number of turns per unit length of the portion of the solenoid which is disposed around the consumable cathode exceeds the number of turns per unit length in the remaining portion of the solenoid, a portion of the solenoid projecting beyond the igniting electrode at the side opposite to the working end face of the consumable cathode to a length exceeding half a length of the portion of the solenoid disposed around the consumable cathode.

Such an arrangement makes it possible to obtain a magnetic field whose maximum is shifted from the igniting electrode to the side opposite to the working end face. Therefore, in the process of operation of the apparatus the plasma flow generated by the consumable cathode is injected into a longitudinal axially-symmetrical magnetic field with a "plug" beyond the working end face of the consumable cathode. The plasma flow, not meeting a retarding potential barrier on its path, passes to the apparatus outlet without any obstacles. Moreover, equipotential surfaces, which are positive relative to the consumable cathode, coverging beyond the igniting electrode at the side opposite to the working end face of the consumable cathode provide a sufficiently effective reflection of the ion component of the plasma to the apparatus outlet, and a radial constituent of the electrical field existing inside the tubular anode prevents ions from drifting to the walls.

The above arrangement of the solenoid further provides for optimum conditions required for stable ignition and maintenance of the arc discharge. In fact, during ignition the cathode spot is initiated on the side surface of the consumable cathode within the region where an acute angle between magnetic lines of force and the surface of the consumable cathode is directed to the working end face thereof. In accordance with the acute angle rule, the cathode spot drifts, in this case, over the side surface of the consumable cathode towards the working end face thereof.

As a result, practically all the ions generated by the consumable cathode are transported without any losses to the outlet of the apparatus, thereby determining the highest efficiency of utilization of the evaporized material in the stable operation of the above apparatus.

In accordance with the invention, the solenoid is expedient to be so constructed that the number of turns per unit length of the solenoid around the consumable cathode be at least two times the number of the remaining portion of the solenoid.

Investigations have demonstrated that the above considered way of stabilization of the cathode spot is effective only in the case where the number of turns per unit length of the solenoid around the consumable cathode exceeds the number of turns per unit length in the remaining portion of the solenoid at least two times.

BRIEF DESCRIPTION OF DRAWINGS

The invention is further described in greater detail with reference to the accompanying drawing in which the vacuum-arc plasma apparatus of the invention is shown in a schematical sectional view.

BEST MODE FOR CARRYING OUT THE INVENTION

A vacuum-arc plasma apparatus comprises a consumable cathode 1 having a side surface 2 and a working end face 3, a solenoid 4 disposed coaxially with the consumable cathode 1, a tubular anode 5 disposed within the solenoid 4, an igniting electrode 6 mounted on a ceramic jumper 7, adjacent the side surface 2 of the consumable cathode 1.

The tubular anode 5 is fixed inside a cylindrical body 8 whereon the solenoid 4 is mounted.

A portion 9 of the solenoid 4 encircles the consumable cathode 1. More than half of the portion 9 of the solenoid 4 is disposed beyond the igniting electrode 6 at the side opposite the working end face of the consumable electrode 1. The half is located behind the igniting electrode 6 on the side opposite to the working end face 3 of the consumable cathode 1. The consumable cathode 1 and the igniting electrode 6 are provided with respective vacuum current inputs 10 and 11 passing through an end cover 12 which is mounted on the cylindrical body 8.

The cylindrical body 8 is connected with a vacuum chamber 13 wherein a substrate 14 is mounted. A cavity 15 is provided for cooling the tubular anode 5. A cavity for cooling the consumable cathode 1 is not shown in the drawing.

An igniting-pulse generator is designated by the reference numeral 16, and a power supply for an arc discharge, by 17.

A DC power supply for the solenoid 4 is not shown in the drawing.

The vacuum-arc plasma apparatus operates as follows.

The power supply 17 for an arc discharge is switched on. Next, the power supply for the solenoid 4 (not shown) is switched on and a magnetic field is obtained, whose lines of force are disposed as shown in the drawing by dotted lines.

Maximum magnetic field intensity of the solenoid 4 is located in that portion thereof which is disposed close to the igniting electrode 6 at the side opposite to the working end face 3. The igniting-pulse generator 16 for the igniting electrode 6 is switched on, and a surface spark discharged is obtained over the ceramic jumper 7 of the igniting electrode 6, which discharge forms a cathode spot of the arc discharge between the side surface 2 of the consumable cathode 1 and the tubular anode 5.

Then the cathode spot drifts towards the working end face 3 of the consumable cathode 1 due to the fact that, in the area where the cathode spot appears, the magnetic lines of force intersect the side surface 2 of the consumable cathode 1 at an acute angle directed towards the working end face 3 of the consumable cathode 1, and moves to the working end face 3 while accomplishing chaotic shifts.

Under the action of an electrical field whose form of equipotentials is determined by the topography of a magnetic field, the generated plasma flow of the evaporized material of the consumable cathode 1 is directed completely towards the substrate holder 14 whereon the articles to be treated are fixed (not shown).

The plasma flow of the evaporized material of the consumable cathode 1 is transported along the tubular anode 5 practically without any losses since the radial electric field prevents the drift of the ion component of plasma onto the walls of the tubular anode 5.

We claim:

1. A vacuum-arc plasma apparatus comprising:
    a cylindrical body;
    a consumable cathode mounted within said cylindrical body at a first axial end thereof, said consumable electrode being part of means for generating plasma;
    means for supporting a substrate to be treated by said plasma located at a second axial end of said cylindrical body;

a working end face being part of said consumable cathode and facing said second axial end of said cylindrical body;

an igniting electrode means for starting an arc discharge in combination with said consumable cathode and said working end face, said igniting electrode disposed alongside of said consumable cathode;

means for generating a longitudinally continuous symmetric magnetic field throughout the interior of said cylindrical body including:

a tubular anode;

a solenoid coaxially disposed with respect to said cylindrical body and encircling said tubular anode and said consumable cathode, said solenoid extending axially beyond said igniting electrode at the side opposite to the working end face of the consumable cathode by a length exceeding half the length of the portion of said solenoid disposed around said consumable electrode, the number of turns per unit length of said portion of said solenoid around said consumable electrode being greater than the number of turns per unit length in the remaining portion of said solenoid;

said magnetic field provides in the presence of the plasma a radial constituent electric field along the entire length of said tubular anode to prevent the plasma from deviating towards the walls of said anode.

2. An apparatus as claimed in claim 1, wherein the number of turns per unit length of the solenoid (4) around the consumable cathode (1) is at least two times the number of turns per unit length of the remaining portion of the solenoid (4).

* * * * *